United States Patent [19]

Hirabayashi et al.

[11] Patent Number: 5,352,939
[45] Date of Patent: Oct. 4, 1994

[54] MASTER SLICE SEMICONDUCTOR INTEGRATED CIRCUIT WITH OUTPUT DRIVE CURRENT CONTROL

[75] Inventors: Yasuhisa Hirabayashi; Yasuhiro Oguchi; Kazuhiko Ookawa; Takashi Sakuda, all of Suwa, Japan

[73] Assignee: Seiko Epson Corporation, Tokyo, Japan

[21] Appl. No.: 838,460
[22] PCT Filed: Jul. 18, 1991
[86] PCT No.: PCT/JP91/00975
 § 371 Date: May 7, 1992
 § 102(e) Date: May 7, 1992
[87] PCT Pub. No.: WO92/02052
 PCT Pub. Date: Feb. 6, 1992

[30] Foreign Application Priority Data

Jul. 19, 1990 [JP] Japan ............ 2-191215
Jul. 19, 1990 [JP] Japan ............ 2-191216
Jul. 19, 1990 [JP] Japan ............ 2-191217
Jul. 19, 1990 [JP] Japan ............ 2-191218
Jul. 19, 1990 [JP] Japan ............ 2-191219
Jul. 19, 1990 [JP] Japan ............ 2-191220

[51] Int. Cl.$^5$ ............................................. H03K 17/16
[52] U.S. Cl. ................................ 307/443; 307/270; 307/468
[58] Field of Search ............... 307/465, 468, 443, 270, 307/451

[56] References Cited

U.S. PATENT DOCUMENTS 4,959,564 9/1990 Steele ............................. 307/443
5,089,722 2/1992 Amedeo ......................... 307/443
5,153,450 10/1992 Ruetz ............................ 307/443

FOREIGN PATENT DOCUMENTS 61-36947 2/1986 Japan .
1304750 12/1989 Japan .
2-87550 3/1990 Japan .

*Primary Examiner*—Edward P. Westin
*Assistant Examiner*—Andrew Sanders
*Attorney, Agent, or Firm*—Spensley Horn Jubas & Lubitz

[57] ABSTRACT

An output current varying circuit 10 includes a control signal generating circuit 12, an output current supplying circuit 14 and an output terminal 16. Circuit 12 receives an output signal Sout of a dedicated logic circuit 11, and an output signal S1 from a predetermined circuit or an external signal S2 from an input terminal 13, and generates first and second control signals C1 and C2. Circuit 14 is constituted by two P-channel MIS transistors Tr1 and Tr2 connected in parallel between high potential Vdd and output terminal 16. When output signal Sout from logic circuit 11 is at H level, transistor Tr2 is in an on state and an output current i at H level appears on output terminal 16. When output signal Sout is a L level and a current value changing signal S is at L level, transistors Tr1 and Tr2 are both in an off state and the output current is zero. When output signal Sout is at L level and signal S is at H level, transistors Tr1 and Tr2 are both in the off state and an output current 2i at H level appears. Thus, the current value of an external Xout supplied to output terminal 16 can be selectively set at i or 2i, so that power consumption can be reduced and flexibility in high power driving can be obtained depending on the environment where the chip is used.

13 Claims, 4 Drawing Sheets

MASTER SLICE SEMICONDUCTOR INTEGRATED CIRCUIT WITH OUTPUT DRIVE CURRENT CONTROL

FIELD OF THE INVENTION

The present invention relates to master slice semiconductor integrated circuits such as gate arrays. More specifically, the present invention relates to master slice semiconductor integrated circuits in which the value of the output current can be variably controlled internally or externally.

BACKGROUND OF THE INVENTION

In general, gate arrays have a row of cells which are a collection of basic cells each comprising a plurality of insulated gate field effect transistors (hereinafter referred to as MIS's) and a plurality of input/output cells (I/O cells), and a large scale logic circuit and the like can be configured as desired by simply providing a wiring channel and the like on the chid with a power line and a signal line depending on user specification.

Various types of cell configuration have been proposed as a library for the input/output cells (I/O cells), and they are all I/O buffer based configuration, in order for the output transistor of I/O cells to be compatible with an external TTL, it needs to have capability of allowing a sink current of 0.4 mA cells at a potential difference of 0.4 V, for example. The value of the output current can be varied by connecting a single output signal line from a dedicated logic circuit comprising internal basic cells to a plurality of I/O cells by changing the wiring layout. However, once it has been incorporated into a chip-packaged electronic circuit after the wiring process has been completed, the value of the output current is consistently fixed and, therefore, there is no flexibility to make it possible to save power consumption depending on changes in system environment or to perform high power driving when required. Though the value of the output current may be varied to some extent by adjusting the voltage level of the external power source, it is not preferred to vary the level of the power source voltage because it has influence on other elements. In recent years, there has been a need for semiconductor integrated circuits which make it possible to actively variably adjust a predetermined value of an output current in the system environment after chip-packaging.

Considering the above-mentioned need, the present invention realizes master slice semiconductor integrated circuits in which the value of the output current can be variably controlled internally or externally.

SUMMARY OF THE INVENTION

Master slice semiconductor integrated circuits have a row of cells which are a collection of basic cells each comprising a plurality of transistors and a plurality of input/output cells (I/O cells) formed around a chip, and the desired logic circuit is configured with the basic cells by providing wiring on the chip. This invention includes a control signal generating means which generates a control signal by performing logical operation according to the output and input signals of the logic circuit and a current value changing signal which is an external signal, and it is also equipped with a current supplying means which is formed between one of the power source potentials and the output terminal in parallel and which has two or more current paths which are opened and closed by control signals from the control signal generating means. In such configuration, control signals for controlling the current supplying means are generated by the control signal generating means according to the logic of the output sisal from the dedicated logic circuit comprising internal basic cells, and the logic of the current value changing means. The current supplying means consists of two or more current paths and these current paths are controlled to open and close by control signals. As a result, the number of current paths may be changed according to the control signals and, therefore, it is possible to select the potential supplied to outside between high and low levels and to select a plurality of discrete values for the output current. Therefore, when the circuit to be connected to outside is driven at the high level, the amount of the current supplied may be increased even after chip-packaging while, when the external circuit is stalled for example, the amount of the current supplied may be decreased to suppress current consumption.

For example, it is needless to say that one of the said power source potentials shall be power source high potential in order to variably control a high level current value and, in addition, configuration which includes a P-channel type insulated gate transistor as a means for opening and closing current paths, is employed. In order to variably control a low level current value, one of the power source potentials shall be a power source low potential, and configuration which includes an N-channel type insulated gate transistor for current paths, is employed.

The circuit of the master slice semiconductor integrated circuits as described above may, in practice, be configured such that all of the control signal generating means and current supplying means are constituted by basic cells. In this case, since circuit connections can be provided by only the wiring process, it is possible to eliminate element forming regions which are unnecessary, resulting in both reduction in chip surface area and more flexibility in wiring. On the other hand, the control signal generating means and the current supplying means may all be configured by input/output cells. In this case, the length of the wiring to connect the input/output cells can be reduced and as a result the reliability of DC and AC characteristics can be improved. In addition, the circuitry may be such that the control signal generating means and the current supplying means are configured using basic cells and input/output cells, respectively.

As a specific layout in the case that there are two current paths for the current supplying means, the present invention employs the following configuration of the input/output cells. The regions in which a pair of insulated gate field effect transistors constituting the current supplying means are formed, are provided symmetrically about a common master output line which is to be connected to the output terminal. Each transistor has a crossunder portion extending close to and in parallel with the common master output line, a plurality of branch gate electrodes which branch in substantially orthogonal directions from the crossunder portion, a diffusion layer formed in self-alignment with the region which lies across those branch gate electrodes, and branch source electrodes and branch drain electrodes which make conductive contact with a pair of regions within the diffusion layer, sandwiching the branch gate electrodes. The plurality of branch drain electrodes branch from the common master output line and are in parallel with the branch gate electrodes while the plurality of branch source electrodes branch from a source common wiring portion and are anti-parallel with the branch gate electrodes.

As described above, it is possible not only to variably control the output current value of either high level logic or low level logic but also to variably output the current values of both of the high level logic and low level logic. For such a purpose, the present invention employs configuration comprising a first control signal generating means which generates a first control signal by performing logical operation according to the output signal of a first circuit of a logic circuit and a first current value changing signal, a second control sisal generating means which generates a second control signal by performing logical operation according to the output signal of a second circuit of the logic circuit and a second current value changing signal, a selection control means which actively selects either the first or second control signal generating means, two or more first current paths which are opened and closed by the first control signal, and two or more second current paths which are formed in parallel between a second power source potential and an output terminal, and which are opened and close by the second control signal. In order to prevent both of the high and low potentials from being connected to the single output terminal simultaneously, the selection control means which actively selects either the second control sisal generating means or the second control signal generating means is provided.

THE BEST MODE OF CARRYING OUT THE INVENTION

Figure 1:
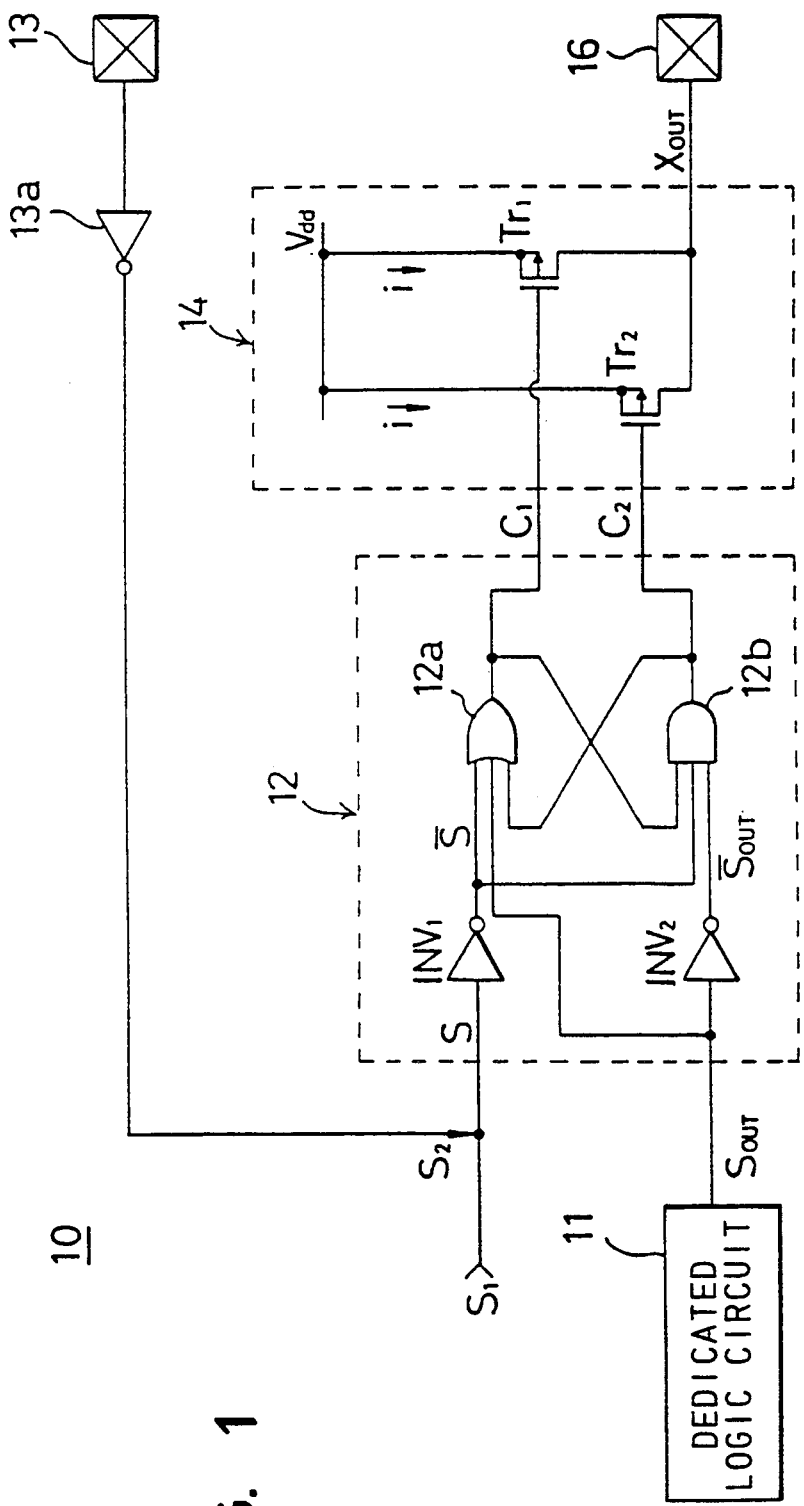
FIG. 1 is a circuit diagram showing an output current value varying circuit of a semiconductor integrated circuit according to a first embodiment of the present invention.

FIG. 1 is a circuit diagram showing an output current value varying circuit of a semiconductor integrated circuit according to a first embodiment of the present invention. The output current value varying circuit 10 varies a current value at a high potential level (hereinafter referred to as H level) and comprises a control signal generating circuit 12, an output current supplying circuit 14, and an output terminal (pad) 16.

The control signal generating circuit 12 has, as its input signal, a predetermined output signal Sout of a dedicated logic circuit comprising internal basic cells, and an output signal (internal signal S1) of a predeterminded circuit comprising internal basic cells or an external signal S2 which is supplied from an input terminal (pad) 13 through a buffer 13a, and generates a first control signal C1 and a second control signal C2. The internal signal S1 and the external signal S2 function as a current value changing signal S. The control signal generating circuit 12 comprises an inverter INV1 which inverts the logic of the current value changing signal S, an inverter INV2 which inverts the logic of the output signal Sout, a three-input OR gate 12a, and a three-input AND gate 12b. The three-input OR gate 12a has input of the output S (bar) of the inverter INV2, the output signal Sout, and the second control signal C2, and outputs the first control signal C1. The three-input AND gate 12b has input of the output signal Sout (bar) of the inverter INV2, the output S (bar) of the inverter INV2, and the first control signal C1, and outputs the second control signal C2.

The output current supplying circuit 14 is constituted by two P-channel MIS transistors Tr1 and Tr2 which are connected in parallel between a power source high potential Vdd and an output terminal (pad) 16. The first MIS transistor Tr1 is gate-controlled by the first control signal C1 and the second MIS transistor Tr2 is gate controlled by the second control signal C2.

In the output current value varying circuit 10 configured as described above, the predeterminded dedicated logic circuit 11 is constituted by an internal cell array while the control signal generating circuit 12 and output current supplying circuit 14 may also be constituted by internal basic cells. It goes without saying that both or either of them may be formed in I/O cells in advance. When the entire output current supplying circuit 14 is constructed in the I/O cells, the length of the wiring to connect the I/O cells can be reduced and, as a result, AC and DC characteristics can be improved. When the entire output current supplying circuit 14 is constructed with basic cells, since it is not a dedicated type in which the pattern is fixed, the surface area of the chip can be reduced and more flexibility can be obtained in wiring. When the current supplying circuit 14 of the output current value varying circuit 10 is constructed in the I/O cells and the control signal generating circuit 12 is constructed with the basic cells, since the control signal generating circuit 12 is not a dedicated type in which the pattern is fixed, the surface area of the chip can be reduced and more flexibility can be obtained in wiring.

Next, the operation of the said output current value varying circuit 10 will be described. When the output signal Sout from the dedicated logic circuit 11 is at H level, the first control signal C1 is at H level and the second control signal C2 is at L level regardless of the logic level of the current value changing signal S. Thus, the first MIS transistor Tr1 is in an off state while the second MIS transistor Tr2 is in an on state. Assuming that the first and second MIS transistors Tr1 and Tr2 are equivalent in device size and characteristics, an output current of a current value i is supplied from the power source high voltage Vdd through the second MIS transistor Tr2 to the output terminal 16. In other words, an output current current value i at H level appears on the output terminal 16. When the output signal Sout of the dedicated logic circuit 11 becomes L level, the logic of the first and second control signals C1 and C2 is determinded according to the logic level of the current value changing signal First, when the current value changing signal is at L level, both of the first and second control signals C1 and C2 are at H level. Since both of the first and second MIS transistors Tr1 and Tr2 are thus in the off state, no current path is formed between the power source high voltage Vdd and the output terminal 16, and the value of the output current is zero. On the other hand, when the current changing signal S is at H level, both of the first and second control signals C1 and C2 are at L level. Since both of the first and second MIS transistors Tr1 and Tr2 are thus in the on state, an output current of a current value 2i flows from the power source high voltage Vdd through two parallel current paths to the side of the output terminal 16 (outside). In other words, an output current of a current value 2i at H level appears. Thus, the current value of an external output Xout at H level supplied to the output terminal 16 can be selectively set at i or 2i by the current value changing signal S and, as a result, power consumption can be reduced according to the environment in which the chip is used and flexibility in high power driving can be improved.

Figure 2:
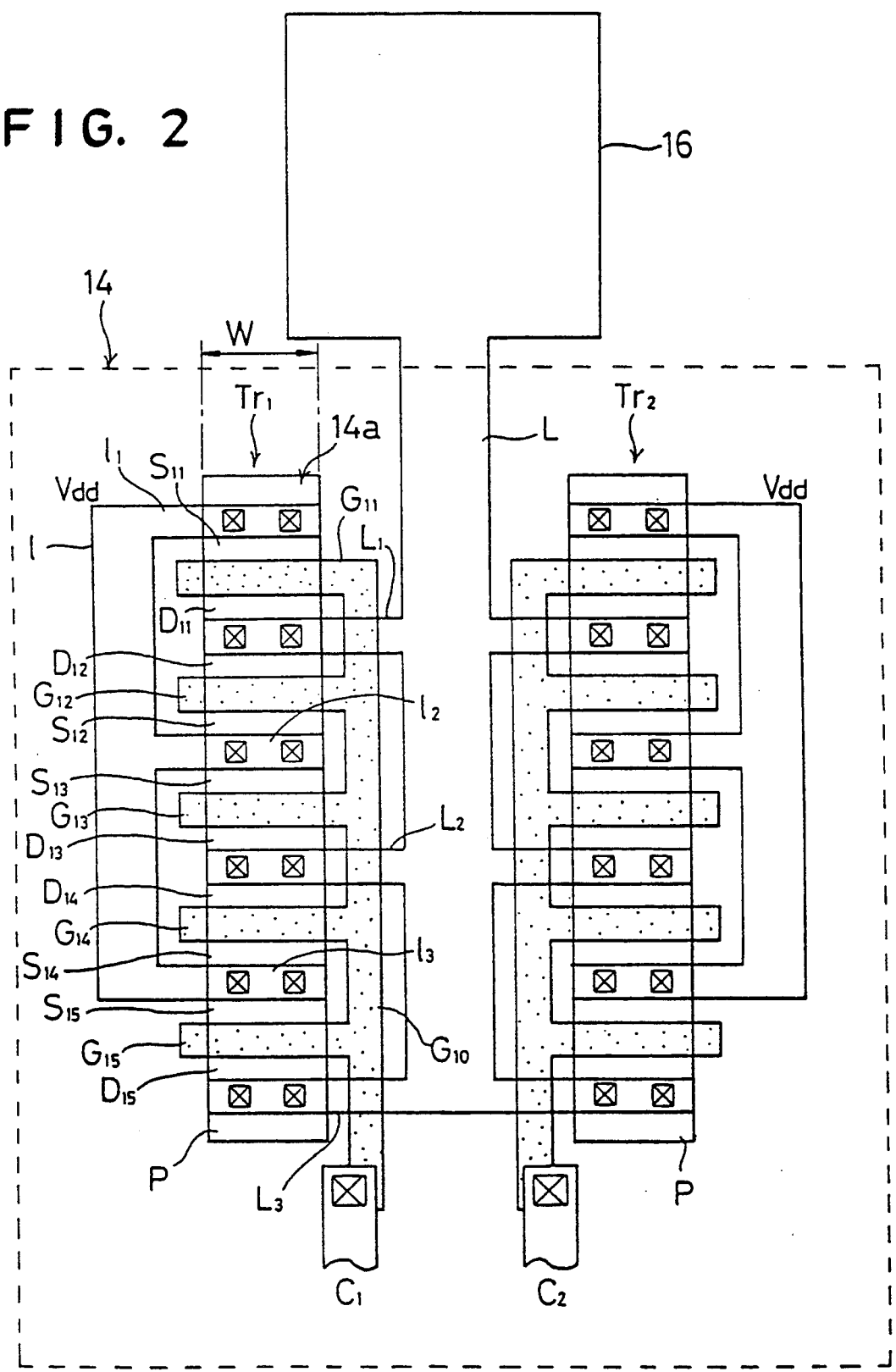
FIG. 2 is a layout diagram showing the semiconductor foxing structure of an output current supplying circuit 14 in the same embodiment.

FIG. 2 is a layout diagram showing the semiconductor forming structure of the output current supplying circuit 14 of the same embodiment. The structure of this output current supplying circuit 14 is formed in an I/O cell region which is a peripheral region of the chip. The pair of P-channel MIS transistors Tr1 and Tr2 constituting the output current supplying circuit 14 are disposed symmetrically about an aluminum common master output line L connected to the rectangular output terminal (pad) 16. Therefore, description will be given only on the structure of the transistor Tr1. A polysilicon gate (polycrystalline silicon gate) of the transistor Tr1 has a crossunder portion G10 which extends close to and in parallel with the common master output line L, and 5 branch gate electrodes G11 through G15 which branch from the crossunder portion G10 at equal intervals. This polysilicon gate is formed through an insulating film (not shown) on the semiconductor substrate, and a diffusion layer (active layer) 14a of P-type impurity is formed in self-alignment with a longitudinal area which crosses the five branch gate electrodes G11 through G15 using them as a mask. On both sides of the branch electrodes G11 through G15, three branch source electrodes 11 through 13 which branch from a source common wiring portion 1 and three branch drain electrodes L1 through L3 which branch from a common master output line L, are disposed in anti-parallel. Therefore, one each MOS portion of a short channel width W is constituted by the following; the branch gate electrode G11, and a source region S11 and a drain region D11 sandwiching it; the branch gate electrode G12, and a drain region D12 and a source region S12 sandwiching it; the branch gate electrode G12, and a source region 513 and a drain region D13 sandwiching it; the branch gate electrode G14, and a drain region D14, a source region and a drain region D11 sandwiching it; and the branch gate electrode G15, and a source region 515 and a drain region D15 sandwiching it. In the structure in which a plurality of MOS portions which appear like a comb, are formed along the common master output line L, the length of the chip can be reduced in the direction of the edges thereof and, as a result, two transistors Tr1 and Tr2 can be incorporated without increasing the width of the I/O cells.

SECOND EMBODIMENT

Figure 3:
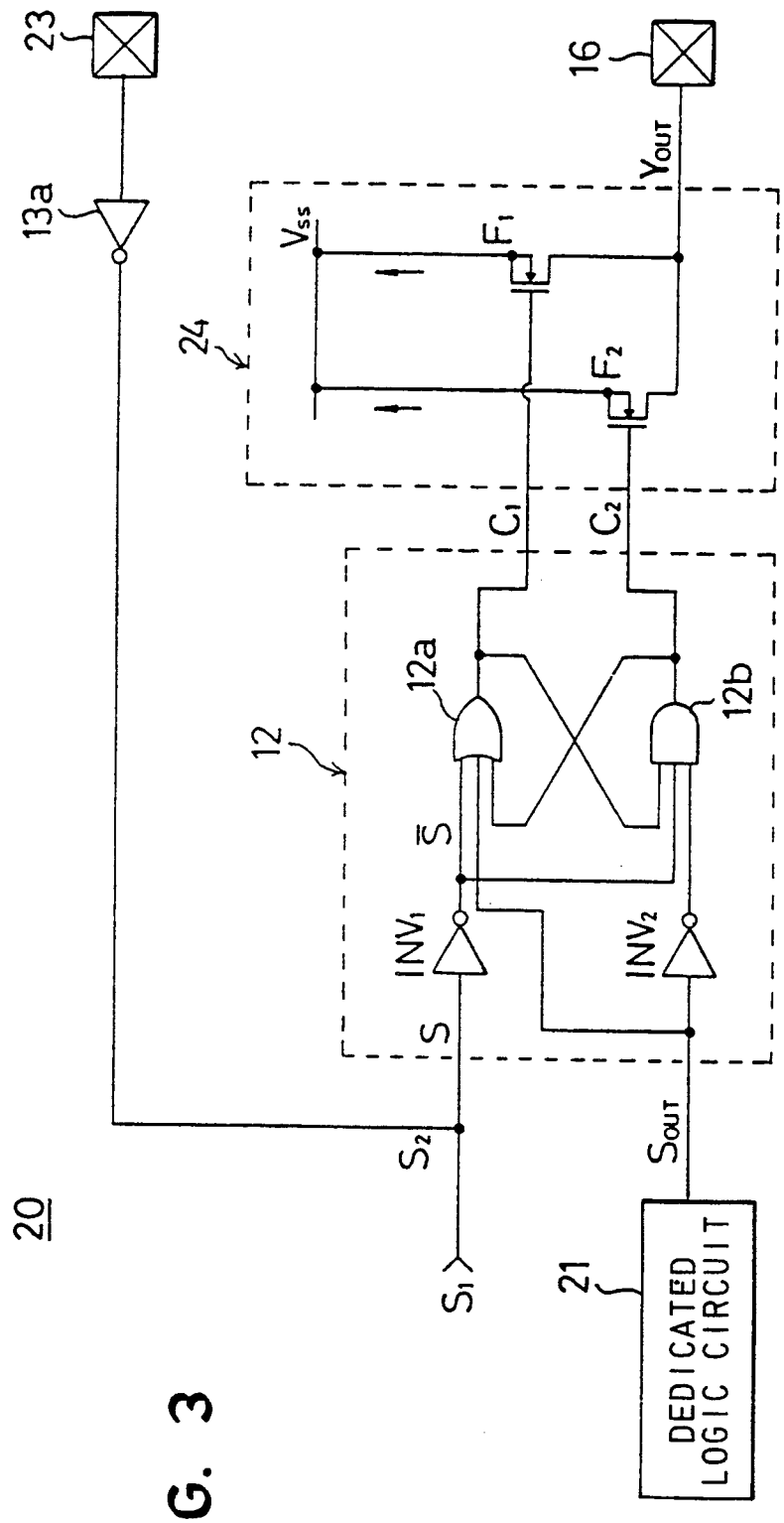
FIG. 3 is a circuit diagram showing an output current value varying circuit of a semiconductor integrated circuit according to a second embodiment of the present invention.

FIG. 3 is a circuit diagram showing an output current varying circuit of a semiconductor integrated circuit according to a second embodiment of the present invention. In FIG. 3, the parts identical to the parts shown in FIG. 1 are given the same reference characters and will not be described. The output current value varying circuit according to this embodiment is also constituted by a control signal generating circuit 12, an output current supplying circuit 24 and an output terminal (pad) 16 but it is different from the first embodiment in the configuration of an output current supplying circuit 24. Specifically, the current supplying circuit 24 is constituted by two N-channel MIS transistors F1 and F2 connected in parallel between a power source low potential (earth potential) Vss and the output terminal (pad) 16. The first MIS transistor F1 is gate-controlled by a first control signal C1 and the second MIS transistor F2 is gate-controlled by a second control signal C2.

As previously mentioned, when Sout is at H level, the first control signal C1 is at H level and the second control signal C2 is at L level regardless of the logic level of the current value changing signal S. Thus, the first MIS transistor F1 is in the on state while the second MIS transistor F2 is in the off state, so if the first and second MIS transistors F1 and F2 are equivalent in device size and characteristics, an output current of a current value i is supplied from the output terminal 16 through the first MIS transistor F1 to the power source low voltage Vss. In other words, an output current of a current value i at L level appears on the output terminal 16. When Sout is at L level and the current value changing signal S is at L level, both of the first and second control signals C1 and C2 are at level. Since both of the first and second MIS transistors F1 and F2 are thus in the on state, an output current of a current value 2i flows from the output terminal 16 through two parallel current paths to the power source low potential (Vss). In other words, an output current of a current value 2i at L level appears. On the other hand, when Sout is at L level and the current value changing signal S is at H level, both of the first and second control signals C1 and C2 are at L level. Since both of the first and second MIS transistors F1 and F2 are thus in the off state, no current path is formed between the power source low voltage Vss and the output terminal 16, and the value of the output current is zero. Thus, the current value of an output signal Yout at L level supplied to the output terminal 16 can be selectively set at either i or 2i according to the current value changing signal S.

THIRD EMBODIMENT

Figure 4:
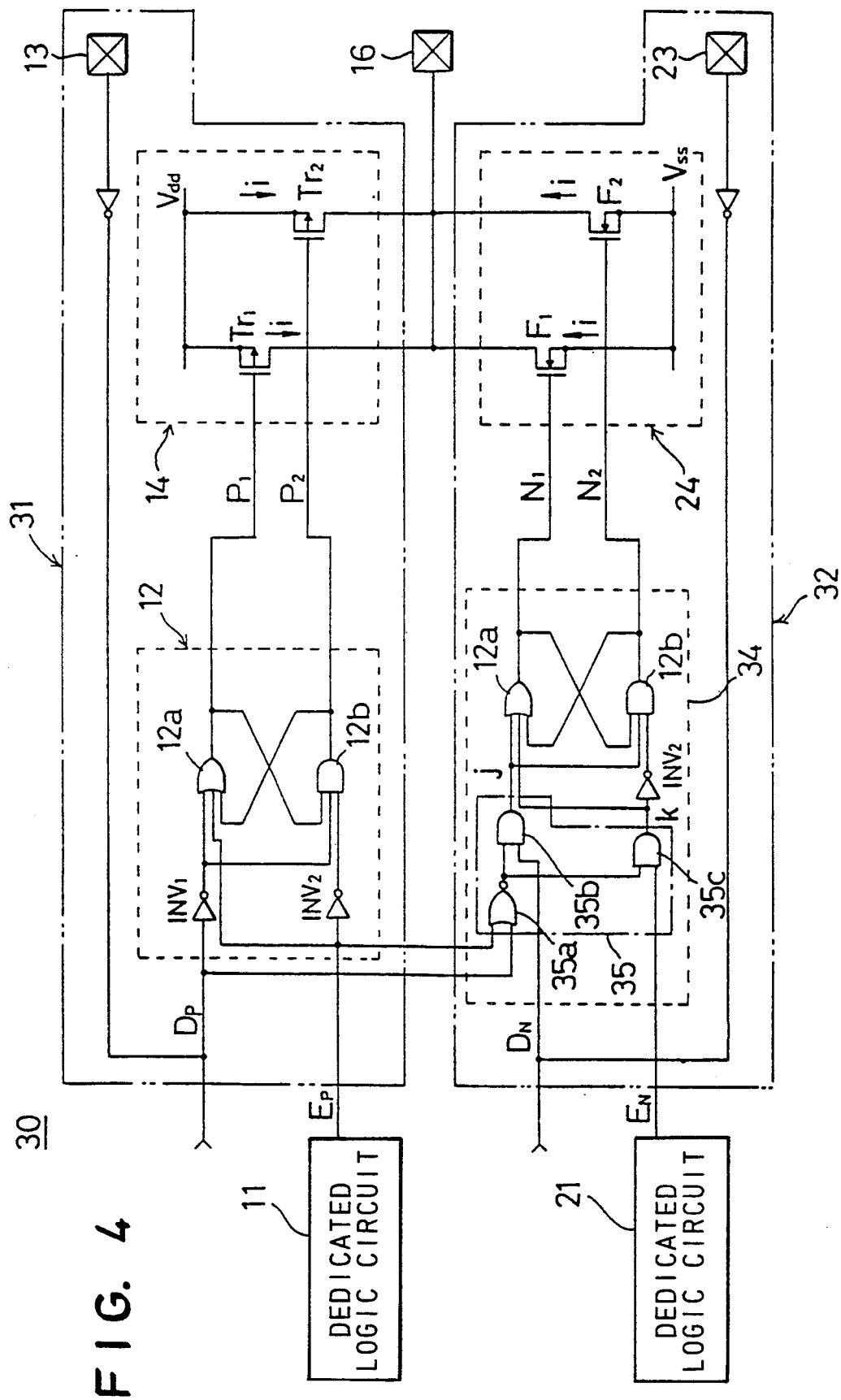
FIG. 4 is a circuit diagram showing an output current value varying circuit of a semiconductor integrated circuit according to a third embodiment of the present invention.

FIG. 4 is a circuit diagram showing an output current varying circuit of a semiconductor integrated circuit according to a third embodiment of the present invention. In this figure, the parts identical to the parts shown in FIG. 1 and FIG. 2 are given the same reference characters and will not be described. This output current value varying circuit 30 is configured so that output current values at H and L levels can be changed, and comprises a high level current value varying circuit 31 and a low level current value varying circuit 32. The high level current value varying circuit 31 has a control signal generating circuit 12 and an output current supplying circuit 14. The high level current value varying circuit 32 has a control signal generating circuit 34 and an output current supplying circuit 24. Since this output current value varying circuit 30 is aimed for supplying an output current at H level or L level to a single output terminal 16, a control selection circuit 35 for eliminating conflict of logic is provided on the side of the low level current value varying circuit Just as in the first embodiment, when an output signal Ep of a dedicated logic circuit 11 is at H level, a first control signal P1 of the control signal generating circuit 12 is at H level and a second control signal P2 is at L level regardless of the logic level of a current value changing signal Dp. Thus, only the second transistor Tr2 is in an on state, so an output current of a current value i is supplied from the power source high voltage Vdd through the transistor Tr2 to the output terminal 16. Since outputs j and k of the selection control circuit 35 on the low level side are both at L level at this time, first and second control signals N1 and N2 of the control signal generating circuit 34 are both at L level, and first and second transistors F1 and F2 on the low level side are both in an Off state.

Next, just as in the first embodiment, when the output signal Ep of the dedicated logic circuit 11 is at L level and the current value changing signal Dp is at L level, the first and second control signals P1 and P2 of the control signal generating circuit 12 are both at H level. Thus, both of the first and second transistors Tr1 and Tr2 are in the on state. Since the output of a NOR gate 35a of the control selection circuit 35 is at H level at this time, AND gates 35b and 35c pass the logic of a current value changing signal D and an output signal E of a dedicated logic circuit 21, and the control signal generating circuit 34 functions in the same way as in the second embodiment. Specifically, since the control signal N1 of the control signal generating circuit 34 is at H level, and the second control signal N2 is at L level when the output signal E of the dedicated logic circuit 21 is at H level regardless of the logic level of the current value changing signal D, only the first transistor F1 is in the on state, and a current value i at L level flows from an output terminal 23 through the first transistor F1 to power source low voltage Vss. When the output signal Ep of the dedicated logic circuit 11 is at H level and the current value changing signal Dp is at L level, both of the first and second control signals N1 and N2 of the control signal generating circuit 34 are at H level. Since the first and second transistors F1 and F2 of the current supplying circuit 24 are both in the on state, a current value 2i at L level flows from the output terminal 23 through the first and second transistors F1 and F2 to the power source low potential Vss. Further, when the output signal Ep of the dedicated logic circuit 11 and the current value changing signal Dp are both at L level, just as in the second embodiment, the first and second control signals N1 and N2 of the control signal generating circuit 34 are both at L level. Thus, the first and second transistors F1 and F2 of the current supplying circuit 24 are both in the off state.

As described above, in this embodiment, the current capacity of the H level logical output can be selectively set at a current value i or 2i, and the the current capacity of the L level logical output can be selectively set at a current value i or 2i.

Through the setting of the output current value is limited to two discrete values in the above embodiments, it goes without saying that three or more discrete values may be set by increasing the number of the parallel current paths.

FIELD OF INDUSTRIAL APPLICATION

As described above, master slice semiconductor integrated circuits according to the present invention are configured so that the value of an output current at H level or L level can be varied under the control of an internal or external signal after chip-packaging and, therefore, they are suitable for use in semiconductor devices for which it is necessary to save power consumption and to temporarily drive at high power according to changes in the system environment.

We claim:

1. A master slice semiconductor integrated circuit comprising:
    a chip;
    a logic circuit formed from a plurality of basic cells composed of a plurality of transistors on said chip, said logic circuit providing an output signal;
    means for providing a current value changing signal;
    a power source line providing a power source potential and an output line with an output terminal on said chip;
    control signal generating means connected to receive the output signal and the current value changing signal for performing a logical operation on the output signal and the current value changing signal in order to produce control signals; and
    a current supplying means having at least two current paths connected in parallel between said power source line and said output line, said current supplying means being connected to receive the control signals so that each current path is opened or closed by a respective control signal,
    wherein the output signal and the current value changing signal are binary logic signals each controllable to have a selected one of a first signal value and a second signal value, and said control signal generating means comprise logic means for producing control signals which cause the current supplying means to supply a current having a first non-zero current value when the output signal has said first signal value, independently of the value of the current value changing signal, and to supply a current having a selected one of second and third current values, each different from the first current value dependent on the signal value of the current value changing signal when the output signal has said second signal value.

2. Master slice semiconductor integrated circuit according to claim 1, characterized in that the said power source potential is a power source high potential and in that the said current paths have a P-channel type insulated gate field effect transistor.

3. Master slice semiconductor integrated circuit according to claim 1, characterized in that the said power source potential is a power source low potential and in that the said current paths have an N-channel type insulated gate field effect transistor.

4. Master slice semiconductor integrated circuit according to claim 2 or claim 3, characterized in that said control signal generating means and said current supplying means are constituted by said basic cells.

5. Master slice semiconductor integrated circuit according to claim 2 or 3, characterized in that said control signal generating means is constituted by said basic cells, and said current supplying means is constituted by input/output cells.

6. Master slice semiconductor integrated circuit according to claim 5, characterized in that the regions in which a pair of field effect transistors constituting said current supplying means are formed, are disposed symmetrically about said output line which is connected to the output terminal; each transistor has a crossunder portion which extends close to and in parallel with the said output line, a plurality of branch gate electrodes which branch from the crossunder portion in a first direction substantially orthogonal to the crossunder portion, a diffusion layer which is formed in self-alignment with a region crossing said branch gate electrodes, and branch source regions and branch drain regions which conductively contact with a pair of regions sandwiching said branch gate electrodes in said diffusion layer; said branch drain regions branch from said output line and are in parallel with said branch gate electrodes; and said branch source electrodes branch from a source common wiring portion in a second direction opposite to the first direction.

7. Master slice semiconductor integrated circuit according to claim 1, characterized in that said control signal generating means and said current supplying means are constituted by said basic cells.

8. A master slice semiconductor integrated circuit which has a row of cells which are a collection of basic cells comprising a plurality of transistors and in which a desired logic circuit is configured with the said basic cells comprising a plurality of transistors and in which said desired logic circuit is configured with the said basic cells by providing a power source line and a signal line on a chip, characterized in that said circuit has first control signal generating means which generates first control signals by performing logical operation according to an output signal of a first circuit of the said logic circuit and a first current value changing signal, a second control signal generating means which generate second control signals by performing logical operation according to an output signal of a second circuit of said logic circuit and a second current value changing signal, a selection control means which actively selects either the first control signal generating means or the second control signal generating means, at least two first current paths which are formed in parallel between a first power source potential and an output terminal and which are opened and closed by the first control signals, and at least two second current paths which are formed in parallel between a second power source potential and said output terminal and which are opened and closed by the second control signals.

9. Master slice semiconductor integrated circuit according to claim 8, characterized in that said first power source potential is a power source high potential and said second power source potential is a power source low potential, and in that said first current paths have a P-channel type insulated gate field effect transistor, and said second current paths have an N-channel type insulated gate field effect transistor.

10. Master slice semiconductor integrated circuit according to claim 8, characterized in that said first and second control signal generating means and said first and second current supplying means are constituted by said basic cells.

11. Master slice semiconductor integrated circuit according to claim 8, characterized in that said first and second control signal generating means are constituted by said basic cells, and said first and second current supplying means are constituted by input/output cells.

12. A master slice semiconductor integrated circuit comprising:
a chip;
a logic circuit formed from a plurality of basic cells composed of a plurality of transistors on said chip, said logic circuit providing an output signal;
means for providing a current value changing signal;
a power source line providing a power source potential and an output line with an output terminal on said chip;
control signal generating means connected to receive the output signal and the current value changing signal for performing a logical operation on the output signal and the current value changing signal in order to produce control signals; and
a current supplying means having at least two current paths connected in parallel between said power source line and said output line, said current supplying means being connected to receive the control signals so that each current path is opened or closed by a respective control signal,
wherein said current supplying means are formed on said chip and comprise a pair of field effect transistors disposed symmetrically about said output line which is connected to the output terminal, each transistor has a crossunder portion which extends close to and in parallel with the said output line, a plurality of branch gate electrodes which branch from the crossunder portion in a first direction substantially orthogonal to the crossunder portion, a diffusion layer which is formed in self-alignment with a region crossing said branch gate electrodes, and branch source regions and branch drain regions which conductively contact with a pair of regions sandwiching said branch gate electrodes in said diffusion layer, said branch drain regions branch from said output line and are in parallel with said branch gate electrodes, and said branch source electrodes branch from a source common wiring portion in a second direction opposite to the first direction.

13. Master slice semiconductor integrated circuit according to claim 1 wherein said logic means of said control signal generating means are operative for switching the control signals from a first state for closing both current paths to a second state for opening both current paths in a manner for causing the two current paths to open sequentially.

* * * * *